United States Patent
Göttfert et al.

(10) Patent No.: US 12,218,688 B2
(45) Date of Patent: Feb. 4, 2025

(54) ERROR CORRECTION WITH FAST SYNDROME CALCULATION

(71) Applicant: Infineon Technologies AG, Neubiberg (DE)

(72) Inventors: Rainer Göttfert, Putzbrunn (DE); Wieland Fischer, Munich (DE); Berndt Gammel, Markt Schwaben (DE); Martin Schlaffer, Zell am See (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/195,469

(22) Filed: May 10, 2023

(65) Prior Publication Data

US 2023/0370091 A1    Nov. 16, 2023

(30) Foreign Application Priority Data

May 10, 2022 (DE) .......................... 102022111624.7

(51) Int. Cl.
*H03M 13/00* (2006.01)
*H03M 13/15* (2006.01)

(52) U.S. Cl.
CPC ..... *H03M 13/1575* (2013.01); *H03M 13/616* (2013.01)

(58) Field of Classification Search
CPC ........... H03M 13/1575; H03M 13/618; H03M 13/617; H03M 13/63; H03M 13/47; H03M 13/3746
See application file for complete search history.

(56) References Cited

U.S. PATENT DOCUMENTS

| | | | |
|---|---|---|---|
| 5,687,182 A | 11/1997 | Shikakura | |
| 6,381,713 B1 | 4/2002 | Irvin et al. | |
| 7,539,926 B1 | 5/2009 | Lesea | |
| 8,132,078 B2* | 3/2012 | Piret .................. | H03M 13/132 |
| | | | 714/752 |
| 8,327,242 B1 | 12/2012 | Anholt et al. | |

(Continued)

FOREIGN PATENT DOCUMENTS

| | | |
|---|---|---|
| DE | 2041320 A1 | 2/1972 |
| DE | 102020110787 B3 | 9/2021 |

OTHER PUBLICATIONS

Russo, Luis M.S., "Sparsifying Parity-Check Matrices", INESC-ID and the Department of Computer Science and Engineering, Instituto Superior Tecnico, Universidade de Lisboa, Portugal, Jul. 31, 2020, 1-61.

(Continued)

*Primary Examiner* — Esaw T Abraham
(74) *Attorney, Agent, or Firm* — Murphy, Bilak & Homiller, PLLC

(57) ABSTRACT

Error correction is proposed, wherein, on the basis of a data word, a syndrome calculation is carried out with a matrix M on the basis of a matrix H of a code, and, if the result of the syndrome calculation reveals that the data word is erroneous, the result of the syndrome calculation is transformed by means of a linear mapping. Next, an error vector is determined on the basis of the result of the linear mapping by means of an efficient error correction algorithm and the erroneous data word is corrected on the basis of the error vector.

14 Claims, 5 Drawing Sheets

(56) References Cited

U.S. PATENT DOCUMENTS

| | | | |
|---|---|---|---|
| 8,522,122 B2* | 8/2013 | Alves | H03M 13/13 |
| | | | 714/784 |
| 9,467,173 B2 | 10/2016 | Hung et al. | |
| 9,690,512 B2* | 6/2017 | Shany | G06F 3/0641 |
| 9,817,714 B2* | 11/2017 | Halbert | G11C 29/52 |
| 10,193,573 B2* | 1/2019 | Goettfert | H03M 13/1565 |
| 10,404,407 B2* | 9/2019 | Shany | H03M 13/1515 |
| 10,572,343 B2 | 2/2020 | Halbert et al. | |
| 11,689,219 B1 | 6/2023 | Kanter et al. | |
| 2002/0184591 A1 | 12/2002 | Chang | |
| 2006/0156175 A1 | 7/2006 | McClellan et al. | |
| 2008/0059867 A1 | 3/2008 | Lin et al. | |
| 2010/0287440 A1 | 11/2010 | Alrod et al. | |
| 2012/0079342 A1 | 3/2012 | Lu et al. | |
| 2017/0077962 A1 | 3/2017 | Yang | |
| 2020/0210284 A1 | 7/2020 | Somasekhar et al. | |

OTHER PUBLICATIONS

Wikipedia, "McEliece Cryptosystem", Wikipedia, URL: https://en.wikipedia.org/w/index.php?title=McEliece_cryptosystem&oldid=1061434367, Mar. 2, 2023, 1-5.

* cited by examiner

ERROR CORRECTION WITH FAST SYNDROME CALCULATION

TECHNICAL FIELD

The approach described here relates to solutions for error processing, comprising, e.g., the detection and/or correction of errors.

SUMMARY

An object of the invention consists in avoiding disadvantages of known solutions for correcting errors, and in particular enabling an efficient correction of errors.

This object is achieved in accordance with the features of the independent claims. Preferred embodiments can be gathered from the dependent claims, in particular.

These examples proposed herein can be based on at least one of the following solutions. In particular, combinations of the following features can be used to achieve a desired result. The features of the method can be combined with (an) arbitrary feature(s) of the device or of the circuit, or vice versa.

In order to achieve the object, a method for error correction is specified,
  wherein, on the basis of a data word, a syndrome calculation is carried out with a matrix M on the basis of a matrix H of a code,
  wherein, if the result of the syndrome calculation reveals that the data word is erroneous, the result of the syndrome calculation is transformed by means of a linear mapping,
  wherein an error vector is determined on the basis of the result of the linear mapping by means of an efficient error correction algorithm,
  wherein the erroneous data word is corrected on the basis of the error vector.

The data word can be arbitrary information, for example a predefined number of bits or bytes.

In one development, no correction is effected if the fact that no error was detected was determined on the basis of the result of the syndrome calculation.

In one development, the matrix M used for the syndrome calculation has the following properties:
  each row of the matrix M has the fewest possible ones,
  the matrix M overall has the fewest possible ones.

In one development, the matrix M used for the syndrome calculation is determined on the basis of the matrix H of the code as follows:
  linear combinations are determined for the row vectors of the matrix H,
  a Hamming weight is determined for each linear combination,
  row vectors of the matrix M are determined on the basis of the linear combinations prioritized according to their rising Hamming weight, coefficients of the linear combinations respectively selected determining rows of a matrix J.

In one development,
  non-trivial linear combinations are determined for the row vectors of the matrix H,
  the Hamming weight is determined for each linear combination,
  the linear combinations are grouped according to their Hamming weight,
  linear combinations are selected in turn with rising Hamming weight and a row of the matrix M is determined on the basis of each selected linear combination and a row of the matrix J is determined on the basis of the coefficients of the selected linear combination,
  the linear combinations are selected with rising Hamming weight until all the rows of the matrix M and all the rows of the matrix J have been determined.

In one development, the linear mapping is based on the inverse matrix $J^{-1}$.

In one development, the matrix $J^{-1}$ is determined such that it has the fewest possible ones per row.

Furthermore, a device for error correction is proposed, comprising a processing unit, configured for carrying out the following steps:
  on the basis of a data word, carrying out a syndrome calculation with a matrix M on the basis of a matrix H of a code,
  f the result of the syndrome calculation reveals that the data word is erroneous, transforming the result of the syndrome calculation by means of a linear mapping,
  determining an error vector on the basis of the result of the linear mapping by means of an efficient error correction algorithm,
  correcting the erroneous data word on the basis of the error vector.

The processing unit mentioned here can be embodied in particular as a processor unit and/or an at least partly hardwired or logical circuit arrangement which is configured for example in such a way that the method as described herein is able to be carried out. Said processing unit can be or comprise any kind of processor or computer with appropriately required peripherals (memory, input/output interfaces, input-output devices, etc.).

The above explanations concerning the method apply, mutatis mutandis, to the device. The respective device can be implemented in one component or in a manner distributed among a plurality of components.

In one development, the device and/or the processing unit are/is configured such that no correction is effected if the fact that no error was detected was determined on the basis of the result of the syndrome calculation.

In one development, the matrix M used for the syndrome calculation has the following properties:
  each row of the matrix M has the fewest possible ones,
  the matrix M overall has the fewest possible ones.

In one development, the matrix M used for the syndrome calculation is determined on the basis of the matrix H of the code as follows:
  determining linear combinations for the row vectors of the matrix H,
  determining a Hamming weight for each linear combination,
  determining row vectors of the matrix M on the basis of the linear combinations prioritized according to their rising Hamming weight, coefficients of the linear combinations respectively selected determining rows of a matrix J.

In one development, the device and/or the processing unit are/is furthermore configured for
  determining non-trivial linear combinations for the row vectors of the matrix H,
  determining the Hamming weight for each linear combination,
  grouping the linear combinations according to their Hamming weight,
  selecting linear combinations in turn with rising Hamming weight, a row of the matrix M being determined on the basis of each selected linear combination and a row of the matrix J being determined on the basis of the coefficients of the selected linear combination, selecting the linear combinations with rising Hamming weight until all the rows of the matrix M and all the rows of the matrix J have been determined.

In one development, the device and/or the processing unit are/is configured such that the linear mapping is based on the inverse matrix $J^{-1}$.

In one development, the device and/or the processing unit are/is configured such that the matrix $J^{-1}$ is determined such that it has the fewest possible ones per row.

Additionally, solutions described herein can take account of or comprise the following approaches: a method for error correction, wherein a syndrome calculation is carried out in a code domain of a second code, wherein an efficient error correction algorithm is carried out in a code domain of a first code.

The code domain is determined for example by a vector space of the code. The code is preferably an error detecting and/or error correcting code. The first code has an efficient error correction algorithm. Preferably, the first code is a code for which such an efficient error correction algorithm is known. By way of example, the first code is one of the following codes: a Hamming code, a BCH code, a Reed-Muller code, a Simplex code, a Golay code or a Goppa code.

Changing between the code domains makes it possible to carry out the syndrome calculation more efficiently in the code domain of the second code and nevertheless to be able to use the efficient error correction algorithm of the first code (after changing back to the code domain thereof).

In one development, between the syndrome calculation and carrying out the efficient error correction algorithm, a transition between the code domains is carried out by means of at least one linear mapping.

In one development,
a data word is received in the code domain of the first code and is converted into the code domain of the second code by means of a first linear mapping,
the syndrome calculation is carried out in the code domain of the second code on the basis of the result of the first linear mapping and, if the result of the syndrome calculation reveals that the data word is erroneous, the result of the syndrome calculation is converted into the code domain of the first code by means of a second linear mapping,
an error vector is determined on the basis of the result of the second linear mapping in the code domain of the first code by means of the efficient error correction algorithm,
the erroneous data word is corrected on the basis of the error vector.

In one development,
the syndrome calculation is carried out in the code domain of the second code on the basis of a received data word and, if the result of the syndrome calculation reveals that the data word is erroneous, the result of the syndrome calculation is converted into the code domain of the first code by means of a second linear mapping,
an error vector of the code domain of the first code is determined on the basis of the result of the second linear mapping in the code domain of the first code by means of the efficient error correction algorithm,
the error vector of the code domain of the first code is converted into an error vector of the code domain of the second code by means of a first linear mapping,
the erroneous data word is corrected on the basis of the error vector of the code domain of the second code.

In one development,
the first code is determined by a matrix H,
the second code is determined by a matrix K,
the first linear mapping P and the second linear mapping L are determined such that the following holds true:

$H = L \cdot K \cdot P.$

In one development, the matrix K is a check matrix comprising a unit matrix.

In one development, the first linear mapping comprises a permutation.

In one development, no correction is effected if the fact that no error was detected was determined on the basis of the result of the syndrome calculation.

An exemplary device for error correction can comprise a processing unit configured for carrying out the method described herein.

Moreover, a computer program product is proposed which is directly loadable into a memory of a digital computer, comprising program code parts suitable for carrying out steps of this method.

Furthermore, the problem mentioned above is solved by means of a computer-readable storage medium, e.g., of an arbitrary memory, comprising instructions (e.g., in the form of program code) which are executable by a computer and which are suitable for the purpose of the computer carrying out steps of the method described here.

The above-described properties, features and advantages of this invention and the way in which they are achieved are described below in association with a schematic description of exemplary embodiments which are explained in greater detail in association with the drawings. In this case, identical or identically acting elements may be provided with identical reference signs for the sake of clarity.

DETAILED DESCRIPTION

Figure 1:
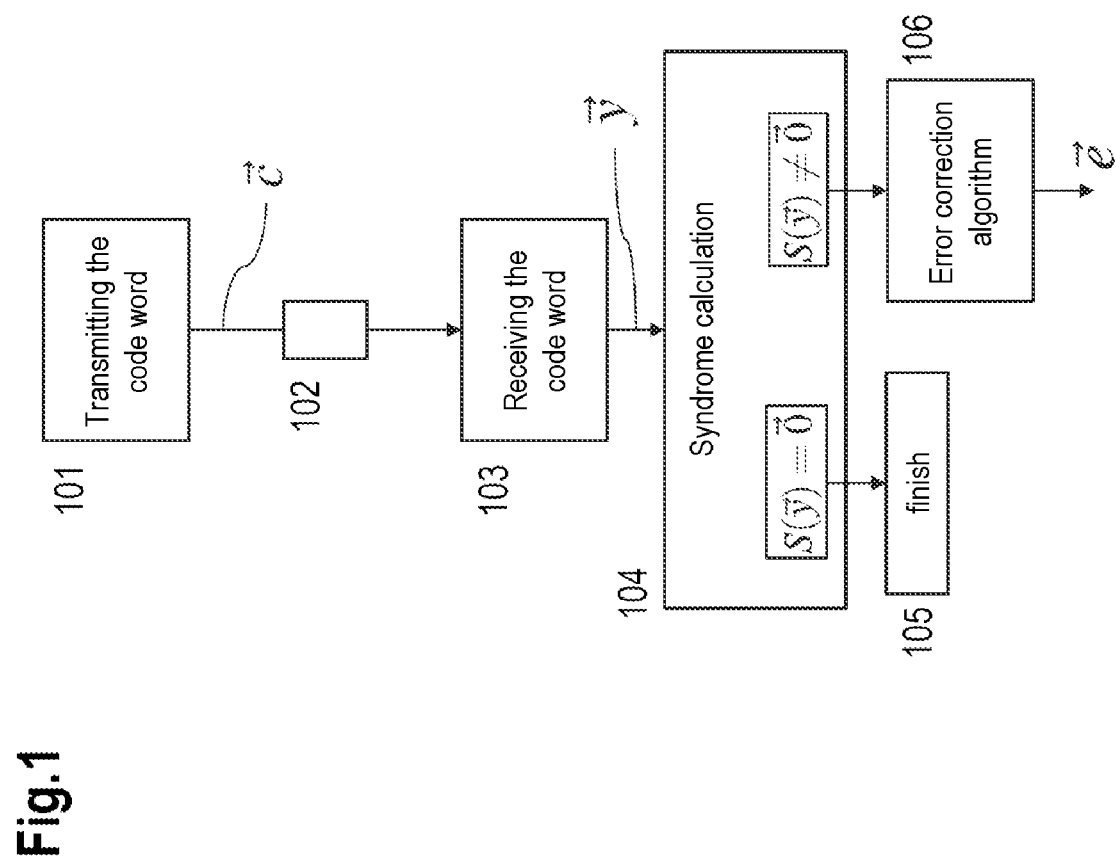
FIG. 1 shows an exemplary flow diagram for elucidating a mode of operation of a decoder for determining an error vector e.

Each binary r×n matrix H of rank r defines a binary linear code C having the length n and the dimension k=n−r. This code is the null space of the matrix H, i.e.

$C = \{\vec{c} \in GF(2)^n : H\vec{c}^T = 0\}$ with
- a code word $\vec{c}$ (also designated as vector $\vec{c}$) of the code C,
- the finite field GF(2)=(0,1) of order two,
- GF(2)$^n$ as n-dimensional vector space (Galois field) of all binary row vectors having the length n, and
- $\vec{c}^T$ as the transpose of the vector (code word) $\vec{c}$.

The matrix H is called the check matrix of the code C. The code C is uniquely defined by the check matrix H. The code is an error detecting and/or error correcting code, for example. A weight (Hamming weight) $w(\vec{y})$ of a binary vector $\vec{y}$ is defined as the number of ones in the binary vector $\vec{y}$. Each linear code contains the null vector $\vec{0}$, having the weight null: $w(\vec{0})=0$.

The smallest weight of all vectors $\vec{c}$ of a linear code C that are different than the null vector is designated as the minimum distance of the code C:

$$d=\min(w(\vec{c}):\vec{c}\in C\backslash\{\vec{0}\})$$

A linear code having the length n, the dimension k and the minimum distance d is designated as (n, k, d) code.

With a code having the minimum distance d, in principle all t-bit errors are correctable, where the following holds true: $0 \leq t < d/2$.

In this case, correctable means, in particular, that the terror positions in the received erroneous code word are uniquely determined. These error positions are not calculable here in all cases (in particular within a predefined time duration).

The error positions are determinable within a predefined time duration only if an efficient error correction algorithm is known for the present code. This is the case for very few linear codes. Codes which have an efficient error correction algorithm are, e.g., the following codes: Hamming code, BCH code, Reed-Muller code, simplex code, Golay code, Goppa code.

In practice, e.g., on computer chips, use is made of codes having an efficient error correction algorithm.

Example 1: Consider a linear code having the length n=100 with a minimum distance d=21. A 10-bit error occurs during data transmission. No efficient error correction algorithm is known for the code. In order to determine the error, all

100!/(90!*10!)=17310309456440 possible error patterns have to be tried out. The syndrome is equal to zero for exactly one error pattern: this error pattern corresponds to the 10-bit error that has occurred. For all other error patterns, the syndrome is not equal to zero. Therefore, approximately 17 billion syndrome calculations are required to determine the 10-bit error.

Example 2: The simplex code having a length n=127 has a minimum distance d=64. There is an efficient error correction algorithm for this code. A 30-bit error occurs during data transmission. The error correction algorithm (implemented in hardware as an electronic circuit comprising 120 flip-flops and XOR and majority gates) allows the 30-bit error to be determined in 127 clock cycles of a processor unit (CPU). The error correction requires only a single syndrome calculation for the initialization of the circuit.

Syndrome

Most error correction algorithms require a syndrome vector (also referred to as syndrome) as input. The syndrome vector is calculated from the received data word with the aid of the check matrix H.

If $\vec{c}$ is the transmitted code word and $\vec{y}$ is the associated received data word, then the vector $\vec{y}$ is a (possibly erroneous) version of the transmitted code word $\vec{c}$. The syndrome of $\vec{y}$ is defined by $$S(\vec{y})=H\cdot\vec{y}^T. \quad (1)$$

If no error has occurred during transmission (or during storage), i.e., if 9=2, then the syndrome is equal to zero, i.e., the syndrome vector $S(\vec{y})$ is identical to the null vector U. By contrast, if a (detectable) error has occurred, then it holds true that: $S(\vec{y}) \neq \vec{0}$.

FIG. 1 shows an exemplary flow diagram for elucidating a mode of operation of a decoder for determining an error vector i.

A code word $\vec{c}$ is determined in a step 101 and is transmitted via a channel 102 and is received as a data word (also referred to as data vector) $\vec{y}$ by the decoder in a step 103. In a step 104, the syndrome calculation is effected in accordance with equation (1).

If the syndrome is equal to zero, then the procedure branches to a step 105; the received data word is identical to the transmitted code word ($\vec{y}=\vec{c}$). In this case, it is assumed that no transmission error has occurred; the received data word $\vec{y}$ is accepted as the transmitted (correct) code word e.

If the syndrome is not equal to zero, then the procedure branches from step 104 to a step 106: since the received data word is different than the transmitted code word ($\vec{y} \neq \vec{c}$), an error correction algorithm is used to determine the error vector e, such that the following holds true:

$$\vec{y}+\vec{e}=\vec{c}. \quad (2)$$

The error correction algorithm calculates error positions from the syndrome vector $S(\vec{y})$ and outputs them in the form of the error vector $\vec{e}$. The received data word $\vec{y}$ is then corrected by a vector $$\vec{y} \oplus \vec{e}$$

being calculated, where "$\oplus$" corresponds to an exclusive-OR operation. This results in a corrected code word $$\vec{c}_{corr}=\vec{y}\oplus\vec{e}, \quad (3)$$

which is assumed to be identical to the transmitted code word c.

The syndrome calculation is preferably always performed, whereas the error correction is only required if the syndrome is not equal to zero.

Example 3: A two-error-correcting code having the length n=40 with a minimum distance d=5 is assumed by way of example. 100000 code words are transmitted. A bit error probability is p=0.001. Consequently, on average approximately 96000 code words are transmitted without errors. In the case of approximately 4000 code words, a 1-bit error or a 2-bit error occurs during transmission, these being corrected automatically. Just a single transmission involves the occurrence of a mufti-bit error (i.e., three or more bits are erroneous) in the transmitted code word. Consequently, on average one of the 100000 received data words cannot be corrected. In 96% of the cases the syndrome is equal to zero and no error correction is necessary. In 4% of the cases the syndrome is not equal to zero and it is only then that the error correction algorithm is required.

Since the syndrome calculation is always carried out, but the error correction is only carried out sometimes, it is expedient to implement the syndrome calculation efficiently. In this way the computation duration is shortened and the power consumption of the decoder is reduced.

Efficient Syndrome Calculation in Software

Canonical Check Matrix

Check matrices of the form $$K=(I,A), \qquad (4)$$

enable an efficient syndrome calculation, for example by means of software. In this case, I represents the unit matrix.

The columns of the unit matrix I are unit vectors, i.e., vectors having only a single one and otherwise all zeroes. The canonical matrix is thus sparsely populated, i.e., it contains relatively few ones overall.

If the check matrix K is used for the syndrome calculation, i.e., a column vector $$Z(\vec{y}) = K \cdot \vec{y}^T \qquad (5)$$

is calculated and used as syndrome, then for the calculation of the coordinates $z_i$ of the syndrome $$Z(\vec{y}) = (z_1, \ldots, z_{n-k})^T \qquad (6)$$

only few coordinates $y_j$ of the vector $\vec{y}=(y_1, \ldots, y_n)$ have to be added together (in the Galois field GF(2) such an addition corresponds to an exclusive-OR operation, also referred to as XOR operation) because the canonical matrix K contains few ones per row.

Consequently, in the case of a hardware implementation, the logical depth of a circuit for calculating the coordinates of the syndrome with the use of the sparsely populated matrix K is smaller than in the case of the syndrome calculation using a more densely populated matrix.

The syndrome calculation by means of such a canonical matrix K is advantageous in the case of a software implementation of the code as well: the (n−k)×(n−k) unit matrix I at the foremost position in the check matrix K=(I,A) has the effect that in the syndrome calculation initially only the last k coordinates $y_j$ of the vector $\vec{y}$ influence the individual row sums. The components of the resulting column vector are determined solely from the last k coordinates of the vector $\vec{y}$. Afterward, the column vector $$(y_1, y_2, \ldots, y_{n-k})^T$$

is added to this column vector in order to obtain the syndrome $Z(\vec{y})$ in accordance with equation (6).

For i=1, . . . , n−k the output but z is at the same place as the corresponding input bit $y_i$. This is advantageous for the programming since, for example, the programming languages C or C++ process data word by word: the bitwise addition of the two column vectors can thus be effected by means of a single instruction.

Example 4: Consider the following canonical check matrix by way of example:

$$K = \begin{pmatrix} 1 & 0 & 0 & 0 & 1 & 0 & 1 \\ 0 & 1 & 0 & 0 & 1 & 1 & 1 \\ 0 & 0 & 1 & 0 & 1 & 1 & 0 \\ 0 & 0 & 0 & 1 & 0 & 1 & 1 \end{pmatrix}. \qquad (7)$$

K is the canonical check matrix of a 1-bit-error-correcting linear code having the length n=7 and the dimension k=3. The syndrome of $$\vec{y}=(y_1, \ldots, y_7)$$

results as follows:

$$Z(\vec{y}) = K \cdot \vec{y}^T = \begin{pmatrix} z_1 \\ z_2 \\ z_3 \\ z_4 \end{pmatrix} = \begin{pmatrix} y_1 \\ y_2 \\ y_3 \\ y_4 \end{pmatrix} \oplus \begin{pmatrix} y_5 + y_7 \\ y_5 + y_6 + y_7 \\ y_5 + y_6 \\ y_6 + y_7 \end{pmatrix}.$$

(end of example 4)

The check matrix H of a linear (n,k,d) code C is not uniquely determined. If J is an invertible (n−k)×(n−k) matrix, then $$H^* = J \cdot H \qquad (8)$$

is likewise a check matrix of the code: the matrices H and H* have the same null space and the code is by definition identical to this vector space. A linear code C therefore has a plurality of different check matrices.

If the linear code C has an efficient error correction algorithm which calculates the error vector $\vec{e}$ from a syndrome $S(\vec{y})=H \cdot \vec{y}^T$ in accordance with equation (1), then the set of different check matrices contains a specific check matrix: this specific check matrix has properties which the error correction algorithm utilizes, and which the other check matrices do not have. Therefore, the error correction algorithm functions only in conjunction with this specific check matrix.

It is only for codes from the simplex family and for the first-order Reed-Muller code that the specific check matrix is already canonical, i.e., in the form (I,A).

In order to improve the efficiency of the syndrome calculation, it is desirable to use a canonical matrix for the syndrome calculation. However, the efficient error correction algorithm demands that the syndrome be calculated with the associated specific check matrix.

Generation of the Canonical Matrix

Let H be an r×n matrix of rank r. A canonical r×n matrix can be determined from this matrix H by carrying out elementary row transformations for the rows of the matrix H. Elementary row transformations correspond to a permutation of rows of the matrix H and a bitwise addition in the Galois field GF(2) of one matrix row to another. Furthermore, columns of the matrix H can be permuted among one another.

By means of a finite number of such operations, a matrix K of the type (I,A) is determined from the matrix H. In principle, any matrix H having a full rank can be transformed into a canonical matrix.

Carrying out elementary row transformations is equivalent to multiplying the matrix H from the left by an invertible r×r matrix A. The permutation of columns of the matrix H is equivalent to multiplying the matrix H from the right by an n×n permutation matrix B.

A permutation matrix is a matrix which has exactly a single one and otherwise only zeroes in each of its rows and in each of its columns.

There are, then, an invertible r×r matrix A and an n×n permutation matrix B, such that $$K = A \cdot H \cdot B \qquad (9)$$

holds true, the resulting matrix K having the canonical form. Consequently, the canonical matrix K is determined from the matrix H on the basis of the two matrices A and B.

The matrices A and B are both invertible. The inverse matrices are designated hereinafter by L and P, respectively, in accordance with the relationships:

$$L := A^{-1}$$

$$P := B^{-1}$$

Since B is a permutation matrix, the inverse matrix P is also a permutation matrix.

Equation (9) is thus equivalent to $$H = L \cdot K \cdot P. \tag{10}$$

The vector $\vec{y} = (y_1, \ldots, y_n)$ is a binary row vector of length n. If equation (10) is multiplied from the right by the column vector $\vec{y}^T$, it follows that $$H \cdot \vec{y}^T = L \cdot K \cdot P \cdot \vec{y}^T. \tag{11}$$

If it is then the case that the dimension k=n−r, the matrix H having r=n−k rows and n columns has the rank r=n−k. This means that the null space of the matrix H is a linear (n,k, d) code C and the matrix H is a check matrix for the code C.

The left-hand side of equation (11) corresponds, in accordance with equation (1), to the syndrome $S(\vec{y})$ of the vector $\vec{y}$ in the code C relative to the check matrix H.

The right-hand side of equation (11) contains the vector $P\vec{y}^T$. Since the matrix P is an n×n permutation matrix, the vector $P\vec{y}^T$ contains the same coordinates as the vector $\vec{y}$, just in a different order.

In the case of a realization in hardware, a mapping $$\vec{y}^T \rightarrow P \cdot \vec{y}^T = \vec{y}'^T \tag{12}$$

in the form of a redistribution can advantageously be implemented (largely) cost-neutrally.

Example 5: Consider a permutation matrix $$P = \begin{pmatrix} 1 & 0 & 0 & 0 \\ 0 & 0 & 1 & 0 \\ 0 & 1 & 0 & 0 \\ 0 & 0 & 0 & 1 \end{pmatrix} \tag{13}$$

and a vector $$\vec{y} = (y_1, y_2, y_3, y_4).$$

What follows therefrom is:

$$\vec{y}'^T = P \cdot \vec{y}^T = \begin{pmatrix} 1 & 0 & 0 & 0 \\ 0 & 0 & 1 & 0 \\ 0 & 1 & 0 & 0 \\ 0 & 0 & 0 & 1 \end{pmatrix} \begin{pmatrix} y_1 \\ y_2 \\ y_3 \\ y_4 \end{pmatrix} = \begin{pmatrix} y_1 \\ y_3 \\ y_2 \\ y_4 \end{pmatrix} = \begin{pmatrix} y'_1 \\ y'_2 \\ y'_3 \\ y'_4 \end{pmatrix}.$$

Figure 2:
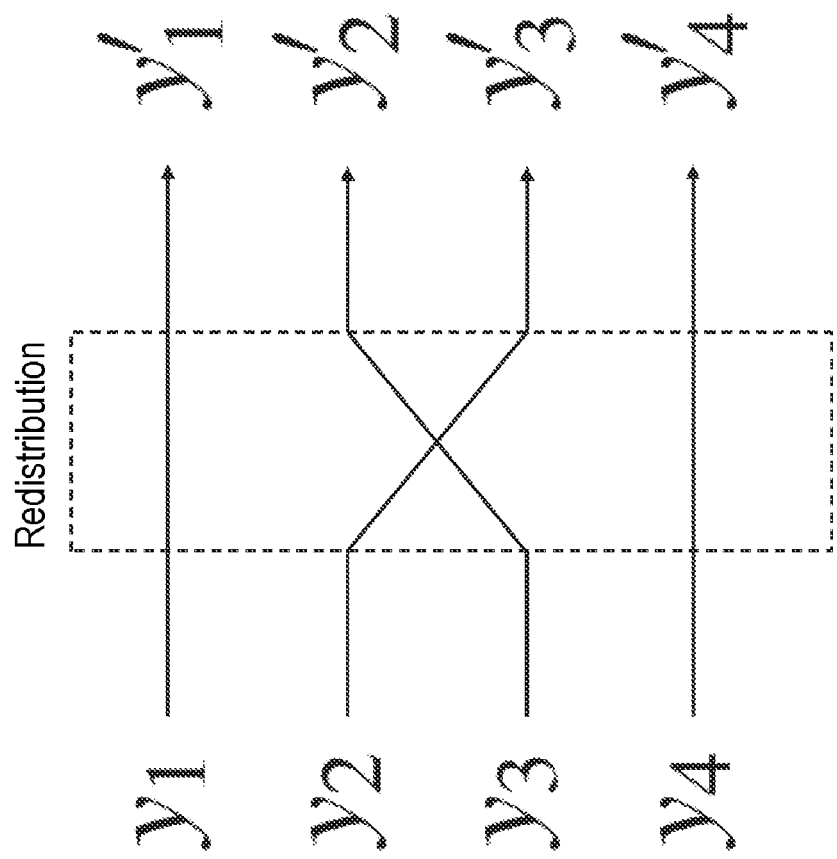
FIG. 2 shows an exemplary circuit diagram for a redistribution.

FIG. 2 shows an exemplary circuit diagram that elucidates a redistribution from $\vec{y}$ to $\vec{y}'$ in accordance with this example. (End of example 5)

Equation (11) can be formulated with equation (12) as follows:

$$H \cdot \vec{y}^T = L \cdot K \cdot P \cdot \vec{y}^T = L \cdot K \cdot \vec{y}'^T. \tag{14}$$

The left-hand side of equation (14) contains the syndrome $S(\vec{y}) = H\vec{y}^T$ in accordance with equation (1), which is required by the error correction algorithm. The right-hand side of equation (14) contains the syndrome $$Z(\vec{y}') = K \cdot \vec{y}'^T.$$

It is thus evident that the two syndromes $S := S(\vec{y})$ and $Z := Z(\vec{y}')$ are linear transformations with respect to one another:

$$S = L \cdot Z. \tag{15}$$

Owing to the permuted matrix columns in the course of deriving the matrix K from the matrix H, the matrix K is not a check matrix for the original code C. Instead the matrix K defines a new code C'.

The old code C and the new code C' have the same parameters n, k and d and the same weight distribution. However, they determine different vector spaces (also referred to as code domains): a code word of the code C is not necessarily also a code word of the code C'. The calculations of the syndromes S and Z thus relate to different codes.

Solution Example

Figure 3:
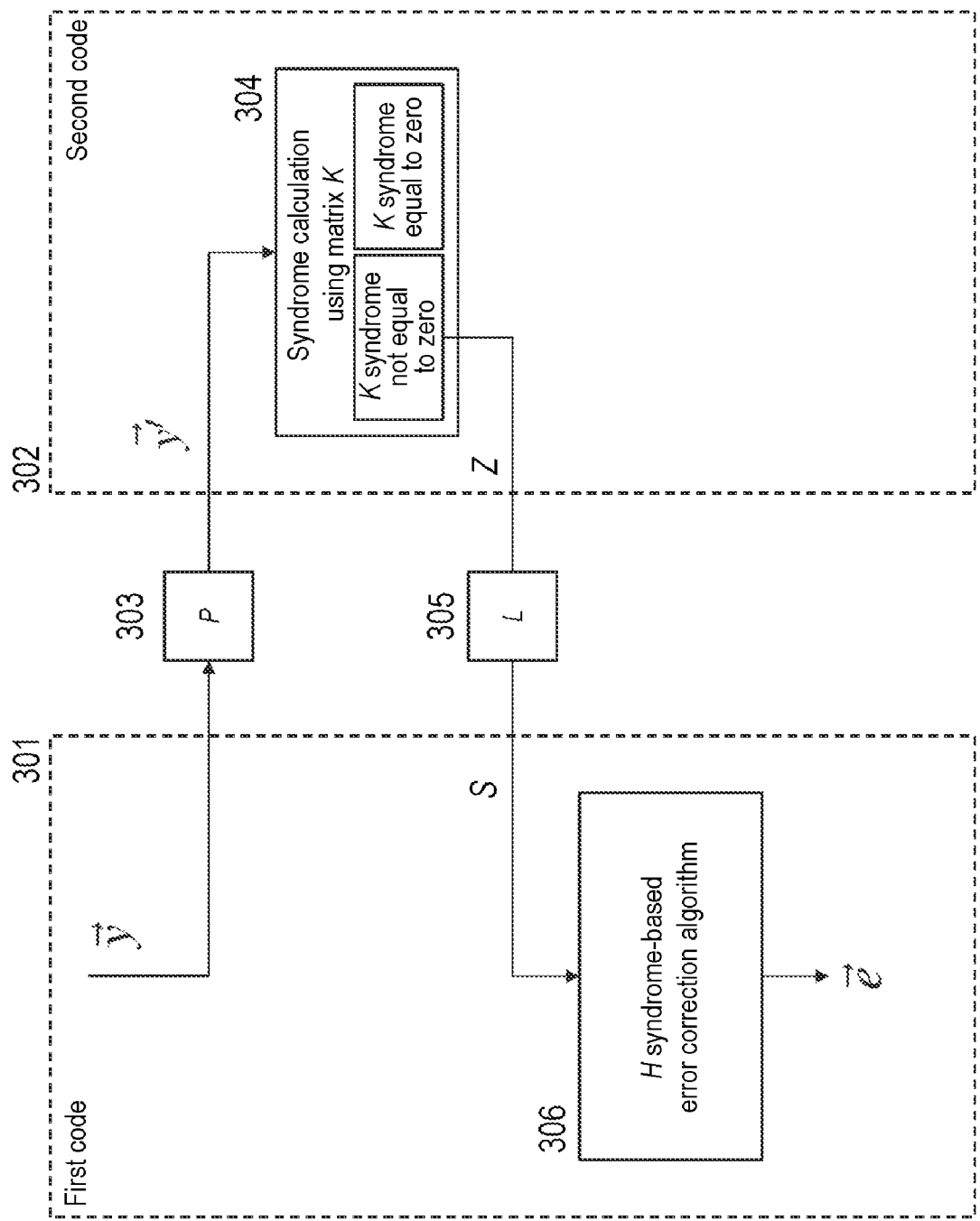
FIG. 3 shows a code domain of a first code and a code domain of a second code, a transition between the code domains being effected by means of (e.g., linear) transformation and an efficient error correction being achieved by the syndrome calculation being effected in the code domain of the second code and the efficient error correction algorithm being effected in the code domain of the first code.

FIG. 3 shows a code domain 301 of a first code and a code domain 302 of a second code. In this context, code domains (vector space) means that the calculations within the domain are specific to the respective code. A transition between the code domains is effected by means of (e.g., linear) transformation.

1. For the first code C there is an efficient error correction algorithm which is based on properties of a specific check matrix H and requires the syndrome $H \cdot \vec{y}^T$ in accordance with equation (1) for the correction of the received data word y.

A message $\vec{m}$ to be transmitted is coded with the first code C in a manner compatible with the matrix H, i.e., a row vector i is multiplied by a generator matrix G belonging to the matrix H in order to calculate a code word $\vec{c}$:

$$\vec{y} = \vec{m} \cdot G.$$

This code word $\vec{c}$ is transmitted and received as a bit sequence $\vec{y}$ (also referred to as received data word, data vector, input or input vector) at the other end of the channel. This bit sequence $\vec{y}$ constitutes the input in the code domain 301 in FIG. 3.

2. Derivation of the canonical matrix:
   For the matrix H, the associated canonical matrix $$K = (I, A),$$

the invertible square matrix L and the permutation matrix P are calculated, such that the following holds true in accordance with equation (10):

$$H \cdot L \cdot K \cdot P.$$

3. Redistribution:
   For the received data word $\vec{y}$, a row vector $$\vec{y}' = \vec{y} \cdot P^T$$

is calculated. This corresponds to a transition 303 from the first code domain 301 to the second code domain 302 by means of the matrix P.

4. Fast syndrome calculation 304:

The syndrome $Z(\vec{y}')$ of $\vec{y}'$ is calculated using the canonical matrix K:

$$Z=Z(\vec{y}')=K\cdot\vec{y}'^T.$$

If Z=0, i.e., the K syndrome is zero, then $\vec{y}$ is error-free. The method can be ended.

If Z≠0, i.e., the K syndrome is not equal to zero, then $\vec{y}$ is not error-free; the procedure branches to the subsequent step (5.) and a linear transformation 305 is then carried out.

5. Linear transformation 305:

The column vector Z is multiplied by the square matrix L. The resulting column vector $$S=L\cdot Z$$

is identical to the required syndrome vector $S=H\cdot\vec{y}^T$. The multiplication by L corresponds to a transition from the second code domain 302 to the first code domain 301.

6. Error vector calculation 306:

By means of the error correction algorithm, on the basis of the syndrome vector S, an error vector i is calculated and output.

7. Error correction:

On the basis of the error vector e, the correction can be carried out: the corrected code word $\vec{c}_{corr}$ results as $$\vec{c}_{corr}=\vec{y}+\vec{c}$$

Since most arriving data words y are error-free, the program already ends with step (4.) in the majority of cases. It is relatively rare for an error to occur in which the K syndrome is not equal to zero, and for steps 5. to 7. be carried out.

In step 4. the syndrome calculation is effected. The time required for this has a crucial effect on the overall performance of the solution presented here.

It should additionally be noted that the syndrome calculation 304 is effected in the code domain 302 of the second code, i.e., after the transition 303 (the transformation by means of P), using the matrix K. This replaces a syndrome calculation without transformation (i.e., within the code domain 301 of the first code) by means of the matrix H(not illustrated in FIG. 3). The syndrome calculation 304 is faster by comparison therewith, and so the resulting additional complexity of the transitions 303 and 305 is of secondary importance relative to the overall performance of the solution presented.

Alternative Solution

An alternative solution is described below. The same prerequisites initially hold true: for a first linear (n,k,d) code there is an efficient error correction algorithm which is associated with a specific check matrix H.

For correction purposes, the error correction algorithm requires as an input the syndrome $S(\vec{y})=H\cdot\vec{y}^T$ defined by the matrix H in accordance with equation (1).

From the matrix H, an equivalent matrix K of the form K=(I,A) can be determined. In this case, "equivalent" means that invertible square matrices L and P of appropriate size exist such that the following holds true in accordance with equation (10):

$$H=L\cdot K\cdot P.$$

In this case, the matrix P is the permutation matrix.

If the matrix P is not itself the unit matrix, then the matrices H and K define different codes. These codes are equivalent to one another since the code words of one code emerge from the code words of the other code by rearrangement according to a fixed specification. Considered as vector spaces, however, they are two different codes. The first code is the null space of the matrix H and the second code is the null space of the matrix K.

In this alternative solution, the message coding is effected by means of the second code, i.e., the code associated with the canonical check matrix K. That has the following advantages, in particular:

1. The coding of the message having a length of k-bits, in the present case as a vector $$\vec{m}=(m_1,\ldots,m_k)$$

can be carried out with the aid of the generator matrix G belonging to the canonical matrix K. This coding is also designated by K coding.

The generator matrix G has the form G=(I,B) with the k×k unit matrix I. The matrix K has the form K=(I,A) with the (n−k)×(n−k) unit matrix I. Consequently, the generator matrix G is likewise a canonical matrix.

The following holds true for the matrices G and K:

$$G\cdot K^T=0,$$

where 0 here denotes the k×(n−k) zero matrix (all matrix entries are zero).

The coding of the message $\vec{m}$ (i.e., the conversion of the message $\vec{m}$ into a code word $\vec{c}$) is achieved by multiplication by the generator matrix G, i.e.

$$\vec{c}=\vec{m}\cdot\vec{r}.$$

Since the generator matrix G is canonical, the code word $\vec{c}$ calculated with it has the form $$\vec{c}=\vec{m}\cdot G.$$

The code word $\vec{c}$ consists of the message vector $\vec{m}$ with the n−k redundancy bits; appended thereto.

Consequently, in the second code (i.e., the null space of the canonical matrix K) both the syndrome calculation and the coding can be performed more efficiently than in the first code (i.e., the null space of the error correction matrix H).

2. FIG. 3 explained above shows an approach for coding the message m in the first code, i.e., in the code with the efficient error correction algorithm. In this case, each received data word $\vec{y}$ is firstly permuted coordinate by coordinate, i.e., the permutation in accordance with the matrix P is applied to each received data word.

The alternative solution described in the present case departs from this: the received data word $\vec{y}$ is already present in coded form in the code with the canonical check matrix K with which the efficient syndrome calculation is also carried out. It can thus be fed unchanged (i.e., without permutation) to the syndrome calculation. If the syndrome is equal to zero, no correction takes place (the received data word is regarded as correct and the method can be ended).

By contrast, if the K syndrome Z is not equal to zero, then it is linearly transformed using the square matrix L The transformed syndrome $$S = L \cdot Z$$

is fed in the error correction algorithm of the first code, which calculates an error vector $\vec{e}'$ therefrom (by means of the first code). In order to determine the associated error vector a from the error vector $\vec{e}'$, this associated error vector being required in the second code for the error correction taking place there, the permutation in accordance with the matrix P is applied to the error vector $\vec{e}'$.

Figure 4:
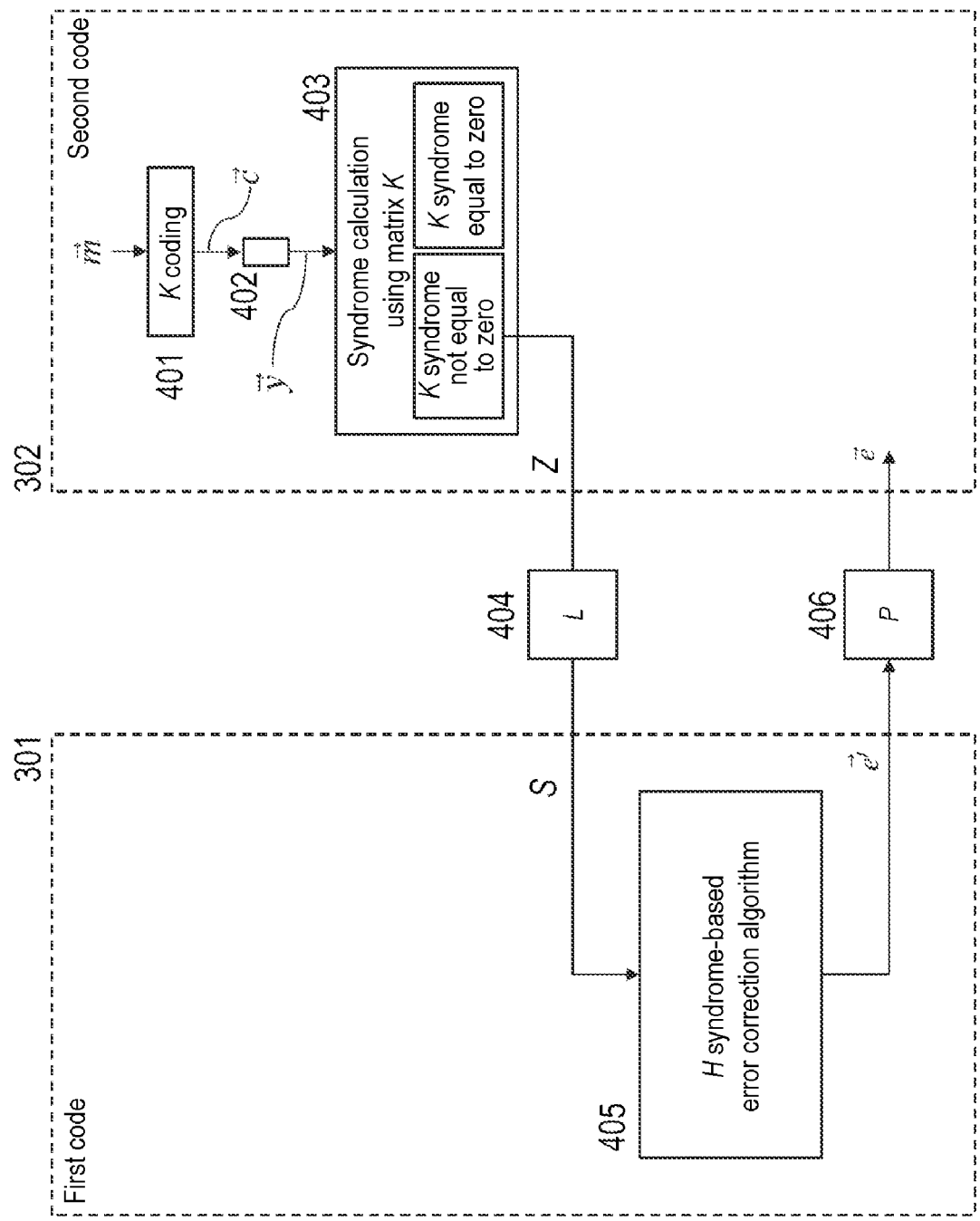
FIG. 4 shows an alternative example to FIG. 3 for the efficient error correction.

FIG. 4 illustrates this relationship on the basis of the code domain 301 of the first code and the code domain 302 of the second code.

In the code domain 302, a K coding 401 of the message vector $\vec{m}$ into the code word $\vec{c}$ is effected, which code word is transmitted via a channel 402 and received as a data word $\vec{y}$. For the received data word $\vec{y}$, a fast syndrome calculation 403 is effected in a manner comparable with the syndrome calculation 304 from FIG. 3: The syndrome $Z(\vec{y})$ of f is calculated using the canonical matrix K:

$$Z = Z(\vec{y}) = K \cdot \vec{y}^T.$$

If Z=0, i.e., the K syndrome is zero, then $\vec{y}$ is error-free. The method can be ended.

If Z≠0, i.e., the K syndrome is not equal to zero, then j is not error-free. In this case, multiplication by the matrix L is used to effect a linear transformation 404

$$S = L \cdot Z,$$

which brings about a transition from the code domain 302 to the code domain 301.

By means of an error correction algorithm 405 of the code domain 301, the error vector $\vec{e}'$ is calculated on the basis of the syndrome vector S and is transformed into the error vector $\vec{e}$ of the second code domain 302 by means of the matrix P 406. The received data word $\vec{y}$ can be corrected on the basis of the error vector $\vec{e}$:

$$\vec{c}_{corr} = \vec{y} + \vec{e}.$$

As a result, the permutation of the solution shown in FIG. 4 is performed less frequently than in the example shown in FIG. 3. This is advantageous particularly in the case of software implementations.

Efficient Syndrome Calculation in Particular by Means of Hardware

A matrix M which can for example be implemented in hardware and is used for the syndrome calculation is intended to have the following properties:
 (A) Each row of the matrix M is intended to contain the fewest possible ones.
 (B) The matrix M is intended overall to contain few ones.

Property (A) is important because the logical depth for the calculation of the individual syndrome coordinates is thus as small as possible. The smaller the logical depth of a circuit, the faster this circuit can be clocked.

Property (B) is important because fewer ones in the matrix means that the matrix can be implemented with a smaller number of XOR gates, which necessitates a smaller semiconductor area.

Consider a matrix H having r×n elements, which is a specific check matrix with respect to an error correction algorithm used. The error correction algorithm requires as input the syndrome $S(\vec{y}) = H \cdot \vec{y}^T$ calculated using the matrix H, where $\vec{y}$ is the vector of the received data word.

With an arbitrary invertible r×r matrix J, a matrix $$M = J \cdot H \tag{16}$$

is also a check matrix for the code.

If all possible invertible binary r×r matrices J are inserted in equation (16) (which leads to a very large number even for low values of r), then the matrix M runs through all existing check matrices of the code (which is defined by the matrix). These check matrices include matrices having the properties (A) and (B).

If equation (16) is multiplied by an inverse matrix $J^{-1}$ on both sides, it follows that:

$$J \cdot M \cdot H. \tag{17}$$

If equation (17) is multiplied by $\vec{y}^T$ from the right, this results in the following:

$$J^{-1} \cdot M \cdot \vec{y}^T = H \cdot \vec{y}^T \tag{18}$$

The right-hand side of equation (18) contains the H syndrome $$S(\vec{y}) = H \cdot \vec{y}^T.$$

The left-hand side of equation (18) contains the syndrome $M \cdot \vec{y}^T$, calculated using the matrix M, multiplied by the matrix $J^{-1}$.

The inverse matrix $J^{-1}$ can be used by way of example in a hardware implementation which does not require the matrix J.

By way of example, the matrix $J^{-1}$ is designated by F, i.e., $F = J^{-1}$.

It is advantageous that the matrix $J^{-1}$ contains the smallest possible number of ones per row. Therefore, a third property for an efficient syndrome calculation in hardware reads as follows:
 (C) The inverse matrix $J^{-1}$ with respect to the matrix J in accordance with equation (16) is intended to contain the fewest possible ones per row.

Figure 5:
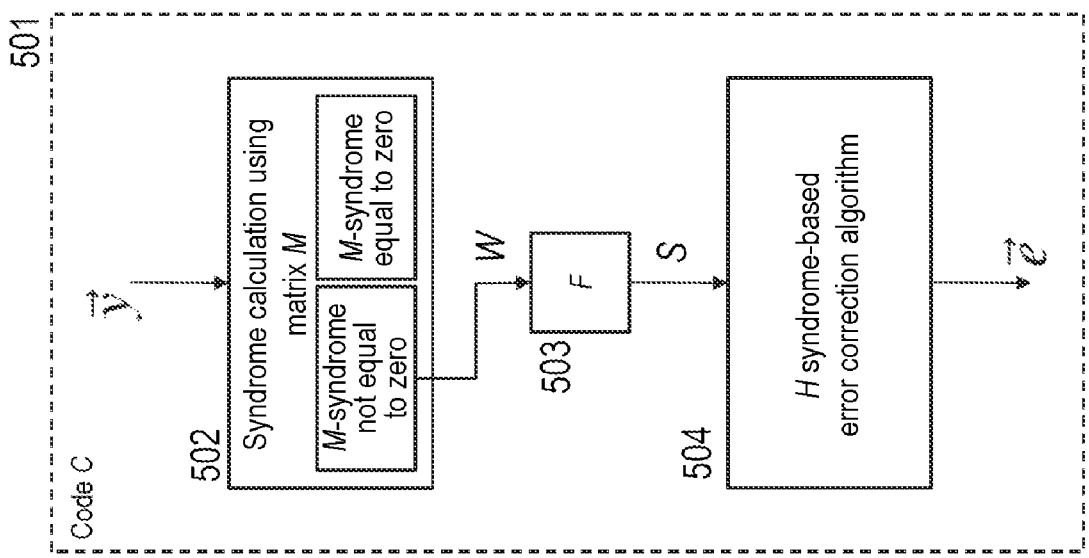
FIG. 5 shows an exemplary diagram for elucidating the efficient syndrome calculation in particular by means of hardware.

FIG. 5 shows an exemplary diagram for elucidating the efficient syndrome calculation by means of hardware. In this case, only one code domain 501 (i.e., one vector space of the code C, for which there is also the efficient error correction algorithm) is assumed by way of example; a transition between different code domains is not required.

On the basis of the received data word $\vec{y}$, a syndrome calculation 502 is effected by means of the matrix M:

$$W = W(\vec{y}) = M \cdot \vec{y}^T.$$

If W=0, i.e., the M syndrome is zero, then y is error-free. The method can be ended.

If W≠0, i.e., the M syndrome is not equal to zero, then y is not error-free, and a linear transformation 503 is carried out by means of the matrix F:

$$S = F \cdot W.$$

On the basis of an error correction algorithm 504, an error vector $\vec{e}$ is calculated on the basis of the syndrome vector S and the received data word $\vec{y}$ can be corrected by means of the error vector $\vec{e}$:

$$\vec{c}_{corr} = \vec{y} + \vec{e}.$$

Calculation of Hardware-Optimized Matrices M and $J^{-1}$

An example of the hardware-optimized determination of the matrices M and $J^{-1}$ is given below.

Let $\vec{h}_1, \ldots, \vec{h}_r$ be the rows of the r×n matrix H.

1. (In particular) all $2^r-1$ non-trivial linear combinations $$k_1 \cdot \vec{h}_1 + \ldots + k_r \cdot \vec{h}_r$$

of the r row vectors are determined.

2. The Hamming weight of each linear combination is calculated and the linear combinations are sorted according to ascending Hamming weight: at the beginning of the list there are the linear combinations having the Hamming weight 1 (if there are any), followed then by the linear combinations having the Hamming weight 2, etc.

Linear combinations having the same Hamming weight can be combined in groups. The arrangement of the linear combinations within a group can be chosen freely or according to a predefined scheme.

3. A linear combination $$\vec{v}_1 = a_1 \cdot \vec{h}_1 + \ldots a_r \cdot \vec{h}_r$$

is selected from the first group. The row vector $\vec{v}_1$ is thus the first row of the hardware-optimized check matrix M to be determined and $(a_1, \ldots, a_r)$ is the first row of the matrix J.

4. If present, a linear combination $\vec{v}_2 \neq \vec{v}_1$ is selected from the first group. If not present, the linear combination $\vec{v}_2$ is selected from the second group. The resulting row vector $\vec{v}_2$ having a length of n bits $$\vec{v}_2 = b_1 \cdot \vec{h}_1 + \ldots b_r \cdot \vec{h}_r$$

corresponds to the second row of the matrix M and $(b_1, \ldots, b_n)$ defines the second row of the matrix J.

5. A linear combination $\vec{v}_3$ where $\vec{v}_3 \neq \vec{v}_1$, $\vec{v}_3 \neq \vec{v}_2$ and $\vec{v}_3 \neq (\vec{v}_1 + \vec{v}_2)$ is selected if possible from the first group, otherwise from the second group, and if even that is not possible, from the third group. The resulting row vector $$\vec{v}_3 = c_1 \cdot \vec{h}_1 + \ldots c_r \cdot \vec{h}_r$$

determines the third row of the matrix M and $(c_1, \ldots, c_r)$ defines the third row of the matrix J.

6. The method is continued accordingly until all r rows of the check matrix M and the associated r rows of the matrix J have been determined.

This approach yields a hardware-optimized check matrix M. In this case, the matrix M is not uniquely determined; there are a large number of such optimized matrices. When selecting a linear combination from a group, there are a plurality of possibilities that lead to different optimized solutions. Each of the optimized check matrices H has the two properties (A) and (B).

The different possibilities for choosing the linear combinations from a respective group ultimately lead to different results for the generated matrices M and J. This results in different inverse matrices $J^{-1}$. In order to find an efficient form for the matrix $J^{-1}$, a plurality of (or all) possibilities for choosing the linear combinations in the respective groups can be tried one after another. Each individual choice made yields a pair of matrices (J,M). By way of example, that inverse matrix $J^{-1}$ having the fewest ones per row can be used. The property (C) is fulfilled in this way.

Application Example

The Error Correction Algorithm

The following matrix H indicated by way of example is the check matrix of a 2-error-correcting linear code having the length n=15, the dimension k=7 and having the minimum distance d=5.

$$H = \begin{pmatrix} 1 & 0 & 1 & 0 & 1 & 0 & 1 & 0 & 1 & 0 & 1 & 0 & 1 & 0 & 1 \\ 0 & 1 & 1 & 0 & 0 & 1 & 1 & 0 & 0 & 1 & 1 & 0 & 0 & 1 & 1 \\ 0 & 0 & 0 & 1 & 1 & 1 & 1 & 0 & 0 & 0 & 0 & 1 & 1 & 1 & 1 \\ 0 & 0 & 0 & 0 & 0 & 0 & 0 & 1 & 1 & 1 & 1 & 1 & 1 & 1 & 1 \\ 0 & 0 & 1 & 0 & 1 & 0 & 0 & 0 & 0 & 0 & 1 & 0 & 1 & 0 & 0 \\ 0 & 0 & 0 & 0 & 0 & 0 & 0 & 0 & 1 & 1 & 0 & 0 & 1 & 1 & 0 \\ 0 & 0 & 0 & 0 & 1 & 0 & 1 & 0 & 0 & 0 & 0 & 1 & 0 & 1 & 0 \\ 0 & 0 & 0 & 0 & 0 & 1 & 1 & 0 & 0 & 1 & 1 & 0 & 0 & 0 & 0 \end{pmatrix}$$

The columns of the matrix H are defined by the Boolean function $$f(w,x,y,z) = w(x+y)$$

For $j=1, \ldots, 15$ the j-th column of the matrix H is created in accordance with the following specification:

1. Calculate the binary representation $(j_0, j_1, j_2, j_3)$ of the integer j.
2. Calculate $$k_0 = f(j_0, j_1, j_2, j_3),$$

$$k_1 = f(j_3, j_0, j_1, j_2),$$

$$k_2 = f(j_2, j_3, j_0, j_1),$$

$$k_3 = f(j_1, j_2, j_3, j_0).$$

The j-th matrix column is then given by $$\vec{h}_j = \begin{pmatrix} j_0 \\ j_1 \\ j_2 \\ j_3 \\ k_0 \\ k_1 \\ k_2 \\ k_3 \end{pmatrix}.$$

The representability of the columns of the check matrix H by a uniform formula results in an efficient error correction algorithm with fast 1-bit-error correction (comparable with the duration for a single syndrome calculation) and an accelerated 2-bit-error correction (computation duration corresponds approximately to that of 15 syndrome calculations).

The error correction algorithm acquires as input the following syndrome having a length of eight bits and defined by the check matrix H, $$S(\vec{y}) = H \cdot \vec{y}^T,$$

where $\vec{y} = (y_1, \ldots, y_{15})$ is the received data word.

Efficient Syndrome Calculation in Software

The matrix H is transformed into the canonical matrix K. For this purpose, the column vectors at the positions 3, 4, 5, 6, 7, 8 and 9 are resorted according to the permutation $$\sigma = (3,4,8,7,5)(6,9).$$

Afterward, a few elementary row operations are performed, such that the 8×8 unit matrix arises at the beginning of the new matrix. In this case, an invertible 8×8 matrix L is obtained as a biproduct. The canonical matrix K results as:

$$K = \begin{pmatrix} 1 & 0 & 0 & 0 & 0 & 0 & 0 & 1 & 0 & 1 & 0 & 1 & 1 & 1 \\ 0 & 1 & 0 & 0 & 0 & 0 & 0 & 1 & 1 & 0 & 1 & 1 & 0 & 1 \\ 0 & 0 & 1 & 0 & 0 & 0 & 0 & 1 & 0 & 0 & 0 & 1 & 0 & 1 \\ 0 & 0 & 0 & 1 & 0 & 0 & 0 & 0 & 1 & 1 & 0 & 0 & 1 \\ 0 & 0 & 0 & 0 & 1 & 0 & 0 & 1 & 1 & 0 & 1 & 1 & 1 & 0 \\ 0 & 0 & 0 & 0 & 0 & 1 & 0 & 0 & 1 & 0 & 0 & 1 & 1 & 0 \\ 0 & 0 & 0 & 0 & 0 & 0 & 1 & 0 & 1 & 1 & 1 & 1 & 0 & 1 & 0 \\ 0 & 0 & 0 & 0 & 0 & 0 & 0 & 1 & 1 & 1 & 1 & 0 & 0 & 0 & 0 \end{pmatrix}$$

There is the following relationship between the matrices H and K:

$$H = L \cdot K \cdot P,$$

where P is a 15×15 permutation matrix that represents the above permutation σ in matrix form. The matrices L and P are given by:

$$L = \begin{pmatrix} 1 & 0 & 0 & 0 & 1 & 1 & 1 & 1 \\ 0 & 1 & 0 & 0 & 1 & 0 & 0 & 1 \\ 0 & 0 & 1 & 0 & 0 & 0 & 1 & 1 \\ 0 & 0 & 0 & 1 & 0 & 1 & 0 & 0 \\ 0 & 0 & 0 & 0 & 1 & 0 & 1 & 0 \\ 0 & 0 & 0 & 0 & 0 & 1 & 0 & 0 \\ 0 & 0 & 0 & 0 & 0 & 0 & 1 & 1 \\ 0 & 0 & 0 & 0 & 0 & 0 & 0 & 1 \end{pmatrix} \text{ and}$$

$$P = \begin{pmatrix} 1 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 1 \end{pmatrix}.$$

The canonical matrix K is used for the syndrome calculation. For this purpose, firstly the received data word $\vec{y}$ is resorted ("redistributed") in accordance with the permutation σ or permutation matrix P indicated above:

$$P \cdot \vec{y} = \vec{y}'^T$$

where $$\vec{y}' = (y_1, y_2, y_4, y_8, y_3, y_9, y_5, y_7, y_6, y_{10}, y_{11}, y_{12}, y_{13}, y_{14}, y_{15})^T.$$

On the basis of the canonical matrix K, the syndrome $$Z = K \cdot \vec{y}'^T.$$

is determined. The syndrome calculation with the aid of the matrix K is able to be carried out in software more efficiently than with the use of the matrix H because the matrix K has the unit matrix a (8×8 unit matrix) at the beginning.

If the syndrome Z calculated using the matrix K for the vector $\vec{y}'$ is equal to zero, the syndrome $$S(\vec{y}) = H \cdot \vec{y}^T$$

is equal to zero and the received data word $\vec{y}$ is (with high probability) error-free.

Otherwise, the linear transformation L is applied to the syndrome Z, resulting in the syndrome $$S(\vec{y}) = H \cdot \vec{y}^T = L \cdot L \cdot Z$$

for the error vector calculation to be carried out.

Efficient Syndrome Calculation in Hardware

A check matrix M that is efficient in the case of a hardware implementation of the code for the syndrome calculation is determined as follows, for example:

$$M = \begin{pmatrix} 1 & 0 & 0 & 0 & 0 & 1 & 0 & 1 & 0 & 0 & 0 & 0 & 0 & 1 \\ 0 & 1 & 1 & 0 & 0 & 0 & 0 & 0 & 0 & 0 & 0 & 0 & 1 & 1 \\ 0 & 0 & 0 & 1 & 0 & 1 & 0 & 0 & 0 & 0 & 0 & 0 & 1 & 0 & 1 \\ 0 & 0 & 0 & 0 & 0 & 0 & 1 & 0 & 0 & 1 & 1 & 0 & 0 & 0 & 1 \\ 0 & 0 & 1 & 0 & 1 & 0 & 0 & 0 & 0 & 0 & 1 & 0 & 1 & 0 & 0 \\ 0 & 0 & 0 & 0 & 0 & 0 & 0 & 1 & 1 & 0 & 0 & 1 & 1 & 0 \\ 0 & 0 & 0 & 0 & 1 & 0 & 1 & 0 & 0 & 0 & 0 & 1 & 0 & 1 & 0 \\ 0 & 0 & 0 & 0 & 0 & 1 & 1 & 0 & 0 & 1 & 1 & 0 & 0 & 0 & 0 \end{pmatrix}$$

The matrix M contains 4 ones in each row, whereas the matrix H has rows having eight ones. The logical depth in the case of the calculation of the syndrome components with the matrix M is two.

By way of example, the first syndrome component $w_1$ of the M-syndrome results in accordance with $$w_1 = (y_1 \oplus y_7) \oplus (y_9 \oplus y_{15}),$$

whereas the first syndrome component $s_1$ of the H-syndrome is determined in accordance with $$s_1 = [(y_1 \oplus y_3) \oplus (y_5 \oplus y_7)] \oplus [(y_9 \oplus y_{11}) \oplus (y_{13} \oplus y_{15})]$$

On account of the smaller logical depth, the syndrome calculation with the aid of the matrix M can be clocked more highly than the syndrome calculation with the aid of the matrix H.

The matrix M contains a total of 32 ones, whereas the matrix H has 48 ones. The implementation costs (i.e., the number of gates) for the matrix M thus turn out to be ⅔ of the implementation costs for the matrix H.

If the syndrome is calculated with the matrix M, it has to be transformed by way of the linear transformation F into the syndrome $H \cdot \vec{y}^T$ required by the error correction algorithm:

$$H \cdot \vec{y}^T = F \cdot M \cdot \vec{y}^T.$$

where the linear transformation is determined by the matrix $$F = \begin{pmatrix} 1 & 0 & 0 & 0 & 1 & 0 & 0 & 0 \\ 0 & 1 & 0 & 0 & 0 & 0 & 0 & 1 \\ 0 & 0 & 1 & 0 & 0 & 0 & 1 & 0 \\ 0 & 0 & 0 & 1 & 0 & 1 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{pmatrix}.$$

The matrices M and F were determined using the algorithm indicated above; the columns of the matrix H were not permuted in the process. Therefore, the matrices H and M define the same code vector space (which is simultaneously the null space of the matrix H and the null space of the matrix M) and no permutation (redistribution) is required.

What is claimed is:

1. A method for error correction in a computing device, the method comprising:
carrying out a syndrome calculation on a coded data word, with a matrix M derived from a check matrix H of a code used to code the coded data word,
transforming the result of the syndrome calculation by means of a linear mapping, in response to the result of the syndrome calculation revealing that the data word is erroneous,
determining an error vector on the basis of the result of the linear mapping by means of an error correction algorithm, and
correcting the erroneous data word on the basis of the error vector.

2. The method of claim 1, wherein the matrix M used for the syndrome calculation has the following properties:
each row of the matrix M has the fewest possible ones, the matrix M overall has the fewest possible ones.

3. The method of claim 1, wherein the method comprises determining the matrix M used for the syndrome calculation on the basis of the matrix H of the code by:
determining linear combinations for the row vectors of the matrix H,
determining a Hamming weight for each linear combination,
determining row vectors of the matrix M on the basis of the linear combinations prioritized according to their rising Hamming weight, coefficients of the linear combinations respectively selected determining rows of a matrix J.

4. The method of claim 3, further comprising
determining non-trivial linear combinations for the row vectors of the matrix H,
determining the Hamming weight is determined for each linear combination,
grouping the linear combinations according to their Hamming weight,
selecting linear combinations in turn with rising Hamming weight, determining a row of the matrix M i on the basis of each selected linear combination and determining a row of the matrix J on the basis of the coefficients of the selected linear combination, and
selecting the linear combinations with rising Hamming weight until all the rows of the matrix M and all the rows of the matrix J have been determined.

5. The method as claimed in claim 4, wherein the linear mapping is based on the inverse matrix $J^{-1}$.

6. The method as claimed in claim 5, wherein the matrix $J^{-1}$ is determined such that it has the fewest possible ones per row.

7. A device for error correction comprising a processing circuit, wherein the processing circuit is configured to:
carry out a syndrome calculation on a coded data word, with a matrix M derived from a check matrix H of a code used to code the coded data word,
determine whether the result of the syndrome calculation reveals that the data word is erroneous,
responsive to determining the result of the syndrome calculation reveals that the data word is erroneous, transform the result of the syndrome calculation by means of a linear mapping, determine, on the basis of the result of the linear mapping, an error vector by means of an error correction algorithm, and correct the erroneous data word on the basis of the error vector.

8. The device of claim 7, wherein the processing circuit is configured such that no correction is effected if the fact that no error was detected was determined on the basis of the result of the syndrome calculation.

9. The device of claim 7, wherein the matrix M used for the syndrome calculation has the following properties:
each row of the matrix M has the fewest possible ones, the matrix M overall has the fewest possible ones.

10. The device of claim 7, wherein the processing circuit is configured to determine the matrix M used for the syndrome calculation on the basis of the matrix H of the code by:
determining linear combinations for the row vectors of the matrix H,
determining a Hamming weight for each linear combination,
determining row vectors of the matrix M on the basis of the linear combinations prioritized according to their rising Hamming weight, coefficients of the linear combinations respectively selected determining rows of a matrix J.

11. The device of claim 10, wherein the processing circuit is further configured to:
determine non-trivial linear combinations for the row vectors of the matrix H,
determine the Hamming weight for each linear combination,
group the linear combinations according to their Hamming weight,
select linear combinations in turn with rising Hamming weight, a row of the matrix M being determined on the basis of each selected linear combination and a row of the matrix J being determined on the basis of the coefficients of the selected linear combination,
select the linear combinations with rising Hamming weight until all the rows of the matrix M and all the rows of the matrix J have been determined.

12. The device as claimed in claim 11, wherein the processing circuit is configured such that the linear mapping is based on the inverse matrix $J^{-1}$.

13. The device as claimed in claim 12, wherein the processing circuit is configured such that the matrix $J^{-1}$ is determined such that it has the fewest possible ones per row.

14. A non-transitory computer-readable medium comprising, stored thereupon, a computer program product that is directly loadable into a memory of a digital computer and that comprises program code parts configured to cause the digital computer to carry out steps of a method for error correction comprising:
carrying out a syndrome calculation on a coded data word, with a matrix M derived from a check matrix H of a code used to code the coded data word,
transforming the result of the syndrome calculation by means of a linear mapping, in response to the result of the syndrome calculation revealing that the data word is erroneous,
determining an error vector on the basis of the result of the linear mapping by means of an error correction algorithm, and
correcting the erroneous data word on the basis of the error vector.

* * * * *